United States Patent [19]
Merg

[11] Patent Number: 5,019,746
[45] Date of Patent: May 28, 1991

[54] PREFABRICATED WIRE LEADFRAME FOR OPTOELECTRONIC DEVICES

[75] Inventor: Heinz R. Merg, Santa Clara, Calif.

[73] Assignee: Hewlett-Packard Company, Palo Alto, Calif.

[21] Appl. No.: 445,430

[22] Filed: Dec. 4, 1989

[51] Int. Cl.⁵ .............................................. H01J 1/62
[52] U.S. Cl. ................................... 313/512; 313/331; 313/499; 313/500; 250/552
[58] Field of Search .............. 313/512, 331, 499, 500, 313/332; 250/552; 337/72

[56] References Cited

U.S. PATENT DOCUMENTS

| | | | |
|---|---|---|---|
| 3,863,075 | 1/1975 | Ironmonger | 313/512 |
| 4,013,915 | 3/1977 | Dufft | 313/499 |
| 4,152,624 | 5/1979 | Knaebel | 313/499 |
| 4,255,688 | 3/1981 | Nagasawa | 313/499 |

Primary Examiner—Donald J. Yusko
Assistant Examiner—N. D. Patel

[57] ABSTRACT

A light-emitting diode lamp comprises a cathode wire having a cup lined with a metal foil formed in its head end, an anode wire parallel to the cathode wire and having a flattened head end lined with a metal foil, a light-emitting diode seated in the cup and connected to the anode with a thin connecting wire, the entire assembly being potted in a transparent material. A leadframe for assembly of LED lamps comprises a pair of elongated strips and a plurality of wire pairs attached to the strips, each wire pair having an anode wire having a layer of metal foil welded to its head end and a cathode wire having a metal foil-lined cup in its head end. A method for preparing wires for leadframe assembly is also described.

9 Claims, 2 Drawing Sheets

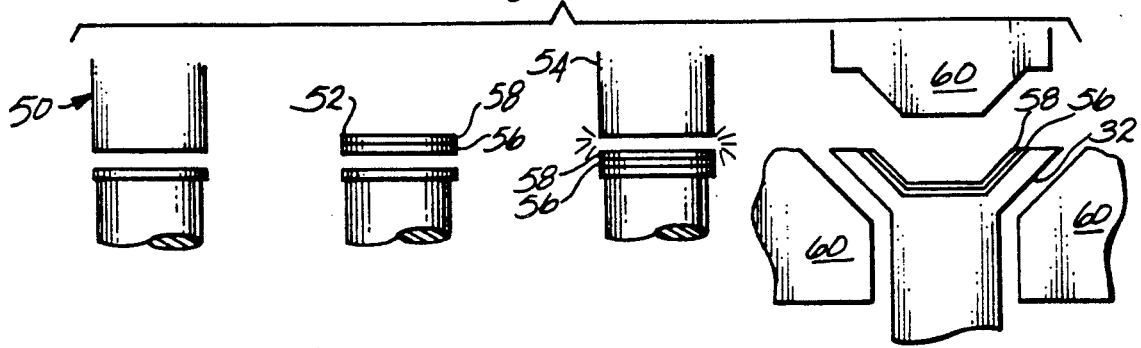
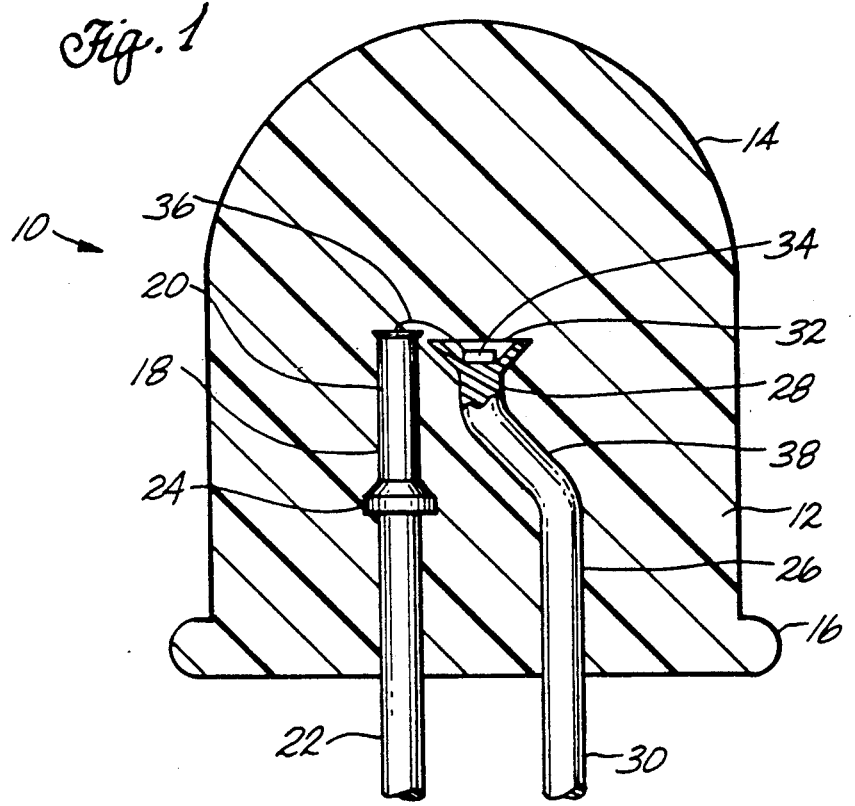
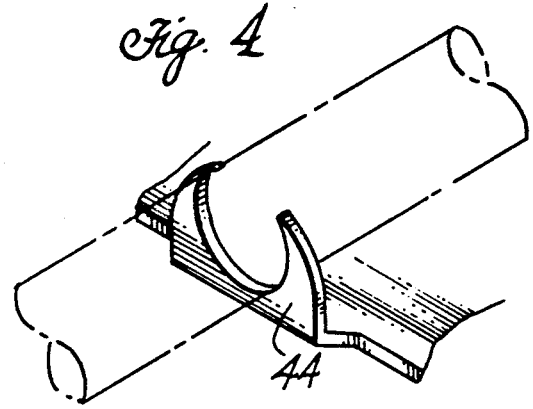

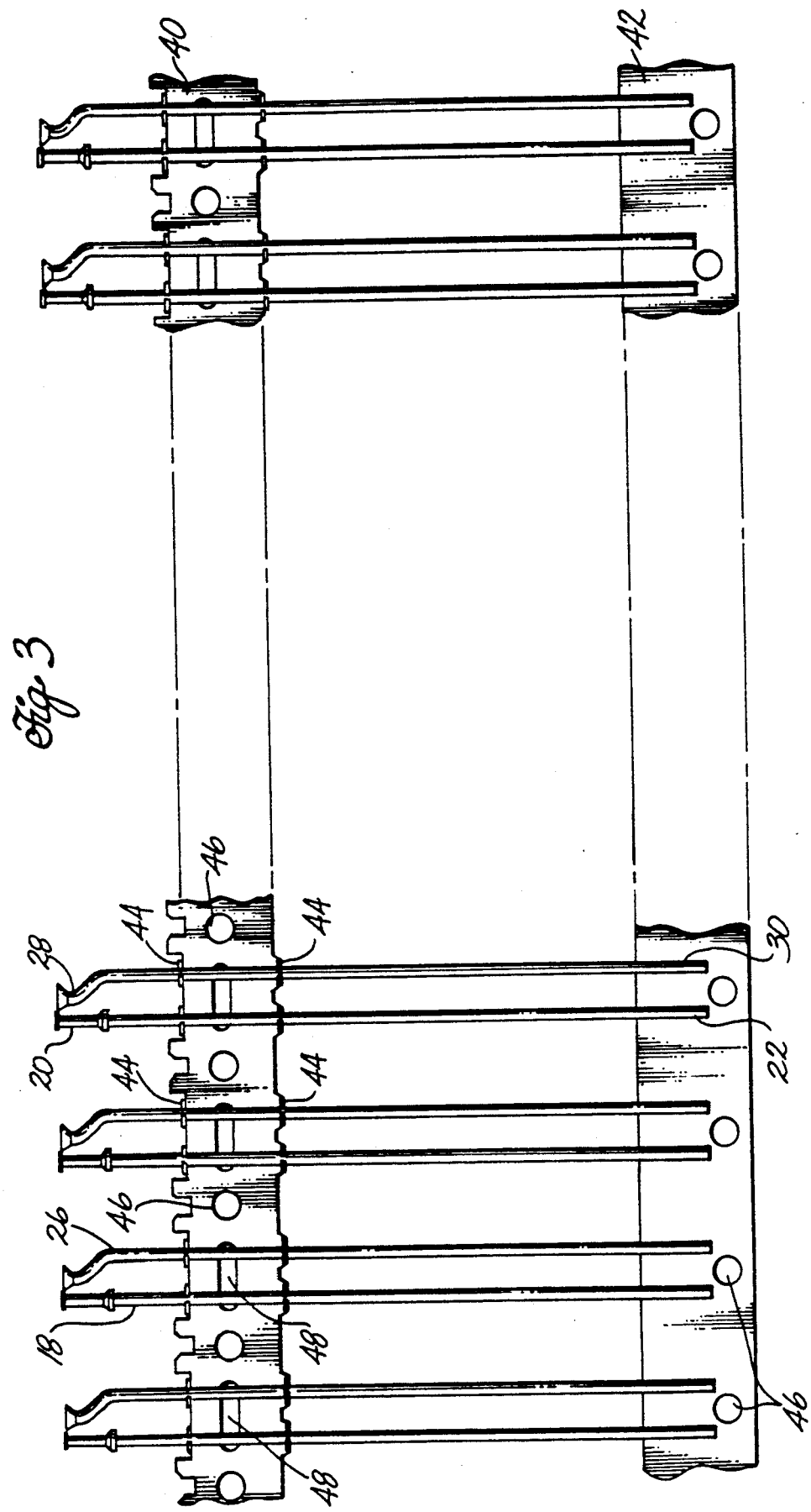

PREFABRICATED WIRE LEADFRAME FOR OPTOELECTRONIC DEVICES

FIELD OF THE INVENTION

The present invention relates to light-emitting diode lamps and wire leadframes for manufacturing light-emitting diodes.

BACKGROUND OF THE INVENTION

Light-emitting diodes ("LEDs") and other optoelectronic devices are ubiquitous in the modern electronics industry. Hundreds of millions of LEDs are produced annually by highly automated processes. LED lamp production begins with the manufacture of an "endless" strip of leadframes, which is cut to yield individual pairs of cathode and anode leads. Each cathode lead is affixed with a light-emitting diode, and the LED and anode lead are connected with a conductive wire. The assembly is then potted in a transparent thermosetting material.

LED leadframes are typically manufactured by a stamping and plating process. A strip of copper or mild steel metal is stamped into the form of a plurality of anode and cathode leads having a desired shape, connected by an integral frame. The metal strip is then plated with a bondable metal to provide electrical leads with a highly conductive surface. Silver is the material of choice for both die attachment and wire bonding in the final assembly of LED lamps. Once plated, the leadframe is cut to a manageable length and used in the assembly of LEDs and other optoelectronic devices.

The cost of traditional leadframe production depends primarily, and in an approximately equal amount, on the steps of stamping the metal strip and silver-plating the stamped strip. Average leadframe cost is approximately $10 per thousand. Given the heavy demand for LEDs, even a slight decrease in leadframe unit cost translates into a tremendous overall cost savings. Accordingly, a method of leadframe production that avoids both stamping and silver-plating would be of great benefit to the electronics industry and, ultimately, consumers.

A related drawback of traditional leadframe production is the large amount of scrap metal that results from the stamping of metal strips into leadframes. A process for leadframe production which avoids the stamping technique would be both financially and ecologically advantageous.

SUMMARY OF THE INVENTION

The present invention provides a leadframe for use in the production of LEDs. The leadframe comprises a pair of elongated strips to which are attached a plurality of wire pairs. Preferably one of the strips is spot welded to each of the wire pairs. The other strip has a plurality of notched flanges or tabs which grasp the wire pairs. Thus, the leadframe is somewhat similar to the bandoliers used in the production of transistors and pin connectors.

Each wire pair consists of an anode wire and a cathode wire. One end of each anode and cathode wire is flattened. A layer of metal foil is welded to this end. A cup is formed in the flattened, clad end of the cathode wire by coining the end.

The present invention also provides an LED lamp having an anode wire and cathode wire that are formed as described above. A light-emitting diode is seated in the cup of the cathode wire and secured thereto with silver cement. A connecting wire is wire bonded to the diode and the anode wire. The cathode, anode, diode, and connecting wire are potted in a transparent thermosetting material.

The present invention further provides a method for preparing wires for use in assembling LEDs, comprising the steps of flattening one end of an anode wire and a cathode wire, welding a layer of silver-nickel foil to the flattened wire ends, and forming a cup in the flattened, silver clad end of the cathode wire. In one embodiment of the invention, the cup is formed by coining the wire.

BRIEF DESCRIPTION OF THE DRAWINGS

FIG. 1 is a longitudinal cross section of a lamp made according to the present invention;

FIG. 2 is a schematic diagram of a method of the present invention;

FIG. 3 is a face view of one embodiment of a leadframe; and

FIG. 4 is a close-up view of a pair of tabs formed on a leadframe.

DETAILED DESCRIPTION OF THE INVENTION

A light emitting diode lamp 10 comprises a body 12 of transparent potting material, such as an epoxy resin, having a domed lens portion 14 and a generally flat, circular base 16.

An anode wire lead 18 has a flattened head end 20 embedded in the transparent resin and a tail end 22 extending through the base 16 for making electrical connections. An annular flange 24 formed on the anode wire near the wire's head end helps secure the anode to the lamp assembly.

A cathode wire lead 26 also has a head end 28 embedded in the transparent resin and a tail end 30 extending through the base for making electrical connections. A cup 32 is formed in the head end of the wire, and a light-emitting diode (LED) 34 is mounted within the cup. A fine connecting wire 36 is wire bonded to both the diode and the head end 20 of the anode wire in a conventional manner.

A short kink 38 is formed in the cathode wire 26 near its head end 28 so that the center of the cup is offset half the distance from the cathode wire to the anode wire. As a result of the kink in the cathode wire, the tail ends 22 and 30, respectively, of the anode and cathode wires are symmetrically located on the flat base 16 of the LED lamp, while the LED 34 in the cathode cup is centered in the domed lens portion 14 of the lamp. The kink also helps prevent the cathode wire from being pulled out of the potting material.

For rapid manufacture of wire leadframes in automatic equipment, a plurality of wire leads are mounted in pairs on semi-continuous elongated metal strips 40 and 42, somewhat in the manner of wires mounted on leadframes employed for manufacturing transistors and other electronic components. An anode wire 18 and cathode wire 26 are positioned next to each other in parallel relation along the length of an upper metal strip 40. The head end 20 or 28 of each wire extends a short distance beyond the outer edge of the upper metal strip, and each wire is held in place near its head end 20 or 28 by two pairs of tabs 44, which are normal to the plane of the strip and which partially encompass the wire. Preferably a small nick (not shown) is provided in the wire adjacent to one pair of tabs, so that the wire is held at a fixed location along its length. The tail end 22 or 30 of each wire is spot welded to the lower metal strip 42. Each of the metal strips has a row of holes 46 for indexing the strips in automatic manufacturing machinery. Additional holes 48 are provided through the upper strip to assist in removing the wires from the strip at the end of the manufacturing operation.

An assembly of such a pair of metal strips and row of pairs of wires is referred to as a leadframe. Such leadframes may be of essentially any length, and in one embodiment they are clipped into lengths of 30 pairs of wires for handling in automatic equipment.

In other embodiments of the invention, the plurality of wire pairs are held in place by one, two or more metal strips, or "bandoliers," of the type just described.

A series of steps for forming the head ends of the wires is indicated schematically in FIG. 2. The wires in the leadframe are first "spanked" with a die 50 which slightly upsets and flattens the end of the wire. A small disk of metal foil 52 is placed on the end of the wire. An electrode 54 then resistance welds the foil to the end of the wire.

In one embodiment of the invention the metal foil is a laminate of nickel and silver, which may be rolled together to a thickness of about 12 micrometers. The nickel face 56 of the foil is placed adjacent to the end of the wire, since nickel is a good material for welding to the copper or steel wire preferably used for LED lamp leads. The silver face 58 of the foil is exposed at the end, since it forms an excellent material for wire bonding the anode lead wire.

When the cup is coined in the head end of the cathode wire the silver-nickel foil is deformed with the wire, and lines the cup. The silver enhances the specular reflection of the cup surface. It also forms a good substrate for receiving the conductive cement used for adhering the LED in the cup.

In other embodiments of the invention the metal foil comprises a bimetallic laminate of a bondable metal such as aluminum, silver, gold, platinum, palladium, etc., and a weldable metal such as an iron-group metal. Alternatively, the metal foil comprises a single metal or alloy that is both weldable to the copper or steel lead wire and bondable.

After a wafer, or layer, of foil has been welded to the head end of each of the anode and cathode wires in the leadframe, the cup 32 is formed in the head end 28 of the cathode wire. Coining dies 60 are used for coining the cup in the end of the cathode wire.

Additional operations are performed on the end of the lead wires, either before or after the steps mentioned above. An annular flange 24 is upset in a portion of the anode wire 18 near its head end 20 and a short kink 38 is formed in the cathode wire near its head end 28.

Such a leadframe formed of pairs of wires connected to a pair of leadframe strips can be as readily handled in automatic equipment as the presently used stamped leadframes, and is less expensive. The copper or steel wire used for making the leads is clearly quite inexpensive, as are the metal strips. The assembly of leadframes from separate parts avoids the substantial scrap stamped from between adjacent leads in the prior integral leadframes employed for optoelectronic devices. By making the lower strip and the lead wires of the same material, the lead wires may be simply sheared off and the strips and adhering bits of wire can be salvaged as scrap without commingling materials. The upper strips can be made of a different material, such as brass, from which the wire holding tabs are readily bent. Possibly of greater significance is the fact that it is not necessary to silver plate the entire leadframe as has been the previous practice, since only a tiny amount of silver is added at the ends of the wires.

Although but one embodiment of a wire leadframe for optoelectronic devices has been described and illustrated herein, many modifications and variations will be apparent to those skilled in the art. Thus, for example, the lead wires have been illustrated as round. If desired, square wires may be used to match equipment previously used for handling leadframes stamped from strip material, where the leads are usually approximately square. Hexagonal wires, or wires having some other shape may also be used. Further, the materials mentioned are merely exemplary and may be changed as desired for particular performance of an LED lamp. The LED lamp geometry is, of course, merely schematic and any of a variety of external shapes may be employed. With such variations in mind it will be apparent that within the scope of the appended claims the invention may be practiced otherwise and as specifically described.

What is claimed is:

1. A light-emitting diode lamp comprising:
   a cathode wire having a head end and a tail end, the head end having a layer of metal foil welded thereto and having a cup shaped depression for holding a light-emitting diode formed therein,
   an anode wire being parallel to the cathode wire and having a head end of the anode wire and a tail end, the head end being flattened and having a layer of metal foil welded thereto;
   a light-emitting diode seated in the cup shaped depression of the cathode wire;
   a connecting wire bonded to the diode and the anode wire; and
   a transparent potting material encasing the head ends of the anode and cathode wires, the diode, and the connecting wire.

2. A light-emitting diode lamp as recited in claim 1, wherein the metal foil comprises a laminated foil having one face composed of a metal suitable for welding to a wire lead and an opposite face composed of a metal suitable for wire bonding.

3. A light-emitting diode lamp as recited in claim 2, wherein the metal suitable for welding is selected from the group consisting of iron-group metals.

4. A light-emitting diode lamp as recited in claim 2, wherein the metal suitable for bonding is selected from the group consisting of gold, silver, platinum, palladium, and aluminum.

5. A light-emitting diode lamp as recited in claim 2, wherein the laminated foil comprises a nickel face welded to the wire lead and an opposite silver face bonded to the connecting wire.

6. A light-emitting diode lamp as recited in claim 1, wherein the metal foil is not less than about 12 micrometers thick.

7. A light-emitting diode lamp as recited in claim 1, wherein the metal foil is deformed with the head end of the cathode wire and lines the cup shaped depression.

8. A light-emitting diode lamp as recited in claim 1 further comprising an annular flange formed on the anode wire near its head end.

9. A light-emitting diode lamp as recited in claim 1, further comprising a kink in the cathode wire near its head end for centering the cup in shaped depression in the potting material.

* * * * *